(12) United States Patent
Manzini et al.

(10) Patent No.: US 6,400,001 B1
(45) Date of Patent: Jun. 4, 2002

(54) VARACTOR, IN PARTICULAR FOR RADIO-FREQUENCY TRANSCEIVERS

(75) Inventors: Stefano Manzini, Novara; Pietro Erratico, Milan, both of (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/493,842

(22) Filed: Jan. 28, 2000

(30) Foreign Application Priority Data

Jan. 29, 1999 (EP) .......................................... 99830044

(51) Int. Cl.[7] .............................................. H01L 29/93
(52) U.S. Cl. ........................ 257/601; 257/598; 257/313
(58) Field of Search ................................ 257/312, 313, 257/532, 601, 598

(56) References Cited

U.S. PATENT DOCUMENTS

| | | | | |
|---|---|---|---|---|
| 3,519,897 A | | 7/1970 | Ferrell | 317/234 |
| 3,562,608 A | * | 2/1971 | Gallagher | 257/313 |
| 4,456,917 A | * | 6/1984 | Sato | 257/601 |
| 4,704,625 A | | 11/1987 | Lee | 357/51 |

FOREIGN PATENT DOCUMENTS

| | | |
|---|---|---|
| EP | 0 633 612 A2 | 1/1995 |
| JP | 60137053 | 7/1985 |
| JP | 61102766 | 5/1986 |
| WO | WO 97/32343 | 9/1997 |

OTHER PUBLICATIONS

Castello et al., "A+/−30% Tuning Range Varactor Compatible with future Scaled Technologies," 1998 Symposium on VLSI Circuits, Digest of Technical Papers, Jun. 11–13, 1998, pp. 34–35.

* cited by examiner

Primary Examiner—Jerome Jackson, Jr.
(74) Attorney, Agent, or Firm—Lisa K. Jorgenson; Robert Iannucci; Seed IP Law Group

(57) ABSTRACT

A varactor has a gate region, first and second biasing regions of $N^+$ type embedded in a well, and first and second extraction regions of $P^+$ type, forming a pair of PN junctions with the well. The PN junctions are inversely biased and extract charge accumulating in the well, below the gate region, when the gate region is biased to a lower voltage than a predetermined threshold value.

21 Claims, 4 Drawing Sheets

VARACTOR, IN PARTICULAR FOR RADIO-FREQUENCY TRANSCEIVERS

TECHNICAL FIELD

The present invention relates to a varactor, and in particular, a varactor for radio frequency transceivers.

BACKGROUND OF THE INVENTION

As known, varactors are electronic devices having a variable capacity, selectable in particular through a biasing voltage, applied between a pair of terminals.

Varactors are used, for example, for tuning LC circuit radio-frequency transceivers. In fact, these circuits are adversely affected by production inaccuracies, and by the low quality factor of the passive components, and thus, in use, require adaptation of the actual reactance value, to adjust it to the planned values.

For this purpose a POS (Polysilicon-Oxide-Semiconductor) varactor has been recently proposed, described for example in the article "A ±30% Tuning Range Varactor Compatible with future Scaled Technologies", by R. Castello, P. Erratico, S. Manzini, F. Svelto, VLSI Symp. on Circuits, Dig. Techn. Papers, June 1998, pp. 34–35, and illustrated in FIG. 1. In detail, a varactor 1 is formed in a wafer 2, only partially shown for easy of representation, comprising a substrate 3, of P-type, having a surface 8 and accommodating a well 4 of $N^-$ type. In turn, the well 4 accommodates two biasing regions 5a and 5b, of $N^+$ type, spaced from one another (but electrically connected, as shown in FIG. 1, by an electrical connection 20) and bias the well 4 to voltage $V_N$.

A gate region 6, made of polycrystalline silicon, extends above surface 8 of wafer 2, at an intermediate wafer portion 7 between biasing regions 5a and 5b, and is electrically isolated from the wafer portion 7 by a gate oxide region 9. The gate region 6 is biased to a voltage $V_G$, via an electrical connection line 21.

As apparent to those skilled in the art, the conductivity of the wafer portion 7 depends on the voltage difference $V_{VAR}=V_G-V_N$ existing between gate region 6 and well 4. In particular, when the gate region 6 is biased to a positive voltage $V_G$, charges (electrons) are accumulated in the wafer portion 7 and the capacity of the varactor 1 increases to a value CMAX, beyond which it remains constant, and can no longer be modulated. This capacity value CMAX, equivalent to the capacity of gate oxide layer 9, is reached for values of $V_{VAR}$ slightly higher than 0 V (for example 0.3 V–0.4 V). If, on the other hand, voltage $V_{VAR}$ is negative, a depletion region 10 is formed in the wafer portion 7, the depth whereof increases along with the absolute value of inverse voltage $V_{VAR}$, thus causing the capacity of the varactor 1 to decrease down to a minimum value CMIN, when the inverse voltage $V_{VAR}$ reaches a negative threshold value $V_T$ (for example of approximately −1.6 V). In fact, below the threshold value $V_T$, in the wafer portion 7, next to the surface 8 of the wafer 2, an inversion layer 11 is formed, comprising minority carriers (here gaps), thermally generated in the depletion region 10. The wafer portion 7 thus defines a capacity modulation region. For example, in a typical MOS process, CMAX is approximately equivalent to 500 nF/cm², and CMIN is approximately equivalent to 250 nF/cm².

However, the present production technology for integrated transceivers requires more extensive variability.

SUMMARY OF THE INVENTION

An embodiment of the present invention provides a varactor, the capacity of which can be modified within a wider range than those obtained at present.

According to the present invention, an embodiment of a varactor is provided, as defined in the claims.

BRIEF DESCRIPTION OF THE DRAWINGS

For the understanding of the invention, an ebodiment is now described, purely by way of non-limiting and non-exhaustive examples, with reference to the attached drawings, in which.

DETAILED DESCRIPTION OF THE ILLUSTRATED EMBODIMENTS

Figure 1:
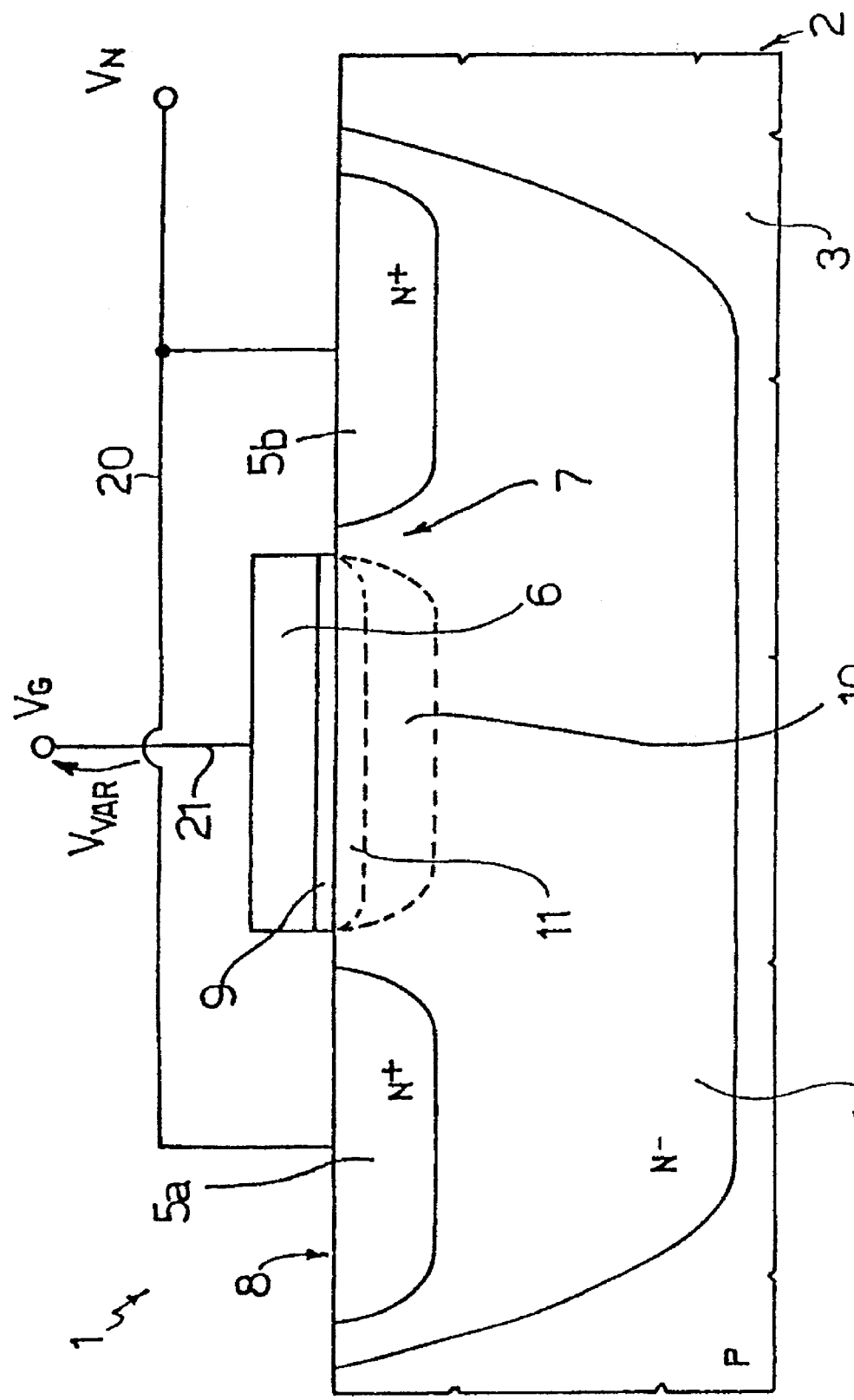
FIG. 1 shows a cross-section through a wafer, incorporating a varactor of a known type.
Figure 2:
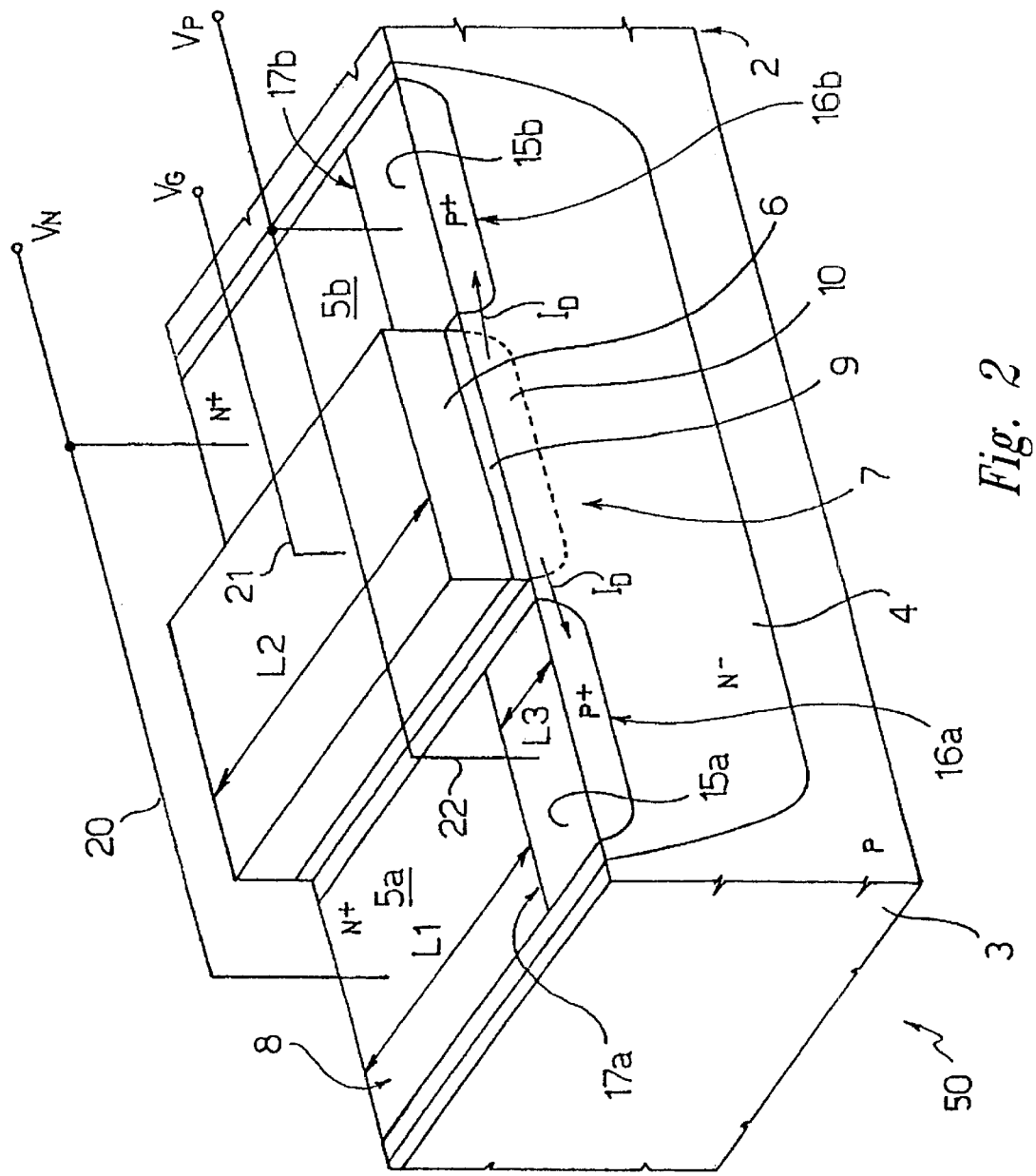
FIG. 2 shows a perspective cross-section through a wafer, incorporating a varactor according to a first embodiment of the present invention.

With reference to FIG. 2, in which parts equivalent to FIG. 1 are indicated with the same reference numbers, a varactor 50 is formed in a wafer 2 of semiconductor material, accommodating a well 4 of $N^-$ type. Similar to FIG. 1, the well 4 comprises two biasing regions 5a and 5b, of $N^+$ type, extending parallel, spaced from one another, for a length L1. The two biasing regions 5a and 5b are also connected electrically via a first electrical connection line 20, and bias the well 4 to voltage $V_N$.

In FIG. 2, the gate region 6, again of polycrystalline silicon, extends parallel to the biasing regions 5a, 5b, above the wafer portion 7, and is insulated by the gate oxide region 9, for a length L2, greater than L1. The gate region 6 is biased to voltage $V_G$ by a second electrical connection line 21.

In addition, as shown in FIG. 2, two charge extraction regions 15a and 15b, of $P^+$ type, extend in continuation of one of the ends of the biasing regions 5a and 5b, for a length L3, equal to the difference between L2 and L1, for example to about one hundredth of L1. For example, L2 may have a length of 10 μm, L3 may be the minimum lithographic dimension (for example 0.35 μm), and L1 is 9.65 μm.

Thus, the charge extraction regions 15a and 15b and the well 4 form a first pair of PN junctions 16a and 16a, and, the charge extraction regions 15a and 15b and the biasing regions 5a and 5b form a second pair of PN junctions 17a and 17b respectively. The charge extraction regions 15a and 15b are electrically connected to one another by a third electrical connection line 22 and are biased to voltage $V_p$.

For example, the well 4 may have a doping level of $2 \times 10^{17} - 3 \times 10^{17}$ atoms/cm³; the biasing regions 5a and 5b and the charge exraction regions 15a and 15b may have a doping level of approximately $10^{20}$ atoms/cm³, with ions imparting opposite types of conductivity.

The varactor 50 functions as follows.

Similarly to the varactor 3 of FIG. 1, the capacity of the varactor 50 is determined by voltage $V_{VAR}=V_G-V_N$ applied between the gate region 6 and the well 4. In addition, voltage $V_p$ of the charge extraction regions 15a and 15b is lower than voltage $V_N$, such that the pairs of PN junctions 16a and 16b, 17a and 17b are always inversely biased when in use. For example, if the biasing regions 5a and 5b are connected to ground ($V_N$=0 V), and $V_G$ varies between +0.4 V and −3 V, the voltage $V_P$ is advantageously −3 V.

When voltage $V_{VAR}$ is positive or negative, but is greater than threshold voltage $V_T$, the charge extraction regions 15a, 15b do not intervene, and the varactor 50 acts in a manner similar to that described with reference to the varactor 1 of FIG. 1.

When the voltage $V_{VAR}$ reaches the threshold value $V_T$, the minority carriers (holes) thermally generated in the depletion region 10, accumulate near the gate oxide region 9, by virtue of the electrical field. However, since the extraction regions 15a and 15b are set to a lower voltage than the well 4, they attract the minority carriers (holes), thus creating a diffusion current $I_D$ through the first pair of PN junctions 16a and 16b, inversely biased. Consequently, the minority carriers are removed from the depletion region 10, and the formation of an inversion layer below the gate oxide region 9 is prevented.

The phenomenon of thermal generation of carriers can be considered virtually stationary, compared with the frequency of the voltage signals typical of the applications commonly using varactors (of approximately hundreds or thousands of MHz). The variations of the diffusion current $I_D$ thus do not influence variations in the capacity of the varactor 50, which therefore are determined only by the depth of the depletion region 10, set by voltage $V_{VAR}$.

The described varactor 50 has the following advantages. First, the values selectable for the capacity of the varactor 50 may vary more extensively than for conventional varactors. In fact, as previously stated, removal of minority carriers from the depletion region 10 prevents the formation of the inversion layer 11 (see, e.g., FIG. 1). Consequently, the capacity of the varactor 50 can assume lower values than the value reached when the inverse voltage $V_{VAR}$ is $V_T$. For example, the capacity of the varactor 50 can vary between approximately 4.4 pF and 1.7 pF, when $V_{VAR}$ varies between +0.4 V and −3 V. In addition, in the voltage range comprised between the maximum voltage and the threshold voltage $V_T$, junctions 16a, 16b are inversely biased (thus forming diodes in the off state), and thus do not modify the normal behavior of the varactor 50.

In addition, the reduction of the minimum capacity CMIN, obtained by removing the minority carriers from the depletion region 10, improves the linearity of the varactor 50, thus eliminating the distortion effects occurring in known varactors, when voltage $V_{VAR}$ approaches threshold voltage $V_T$.

The fact that the extraction regions 15a and 15b are integrated with the device constitutes a further advantage. In fact, these regions 15a and 15b can be biased to inverse voltages compatible with the supply voltages provided to the circuitry interacting with the varactor 50 and do not require specific components for biasing.

Finally, it is apparent that many modifications and variants can be made to the embodiment of the varactor 50 described and illustrated here, within the scope of the invention, as defined in the attached claims.

Figure 3:
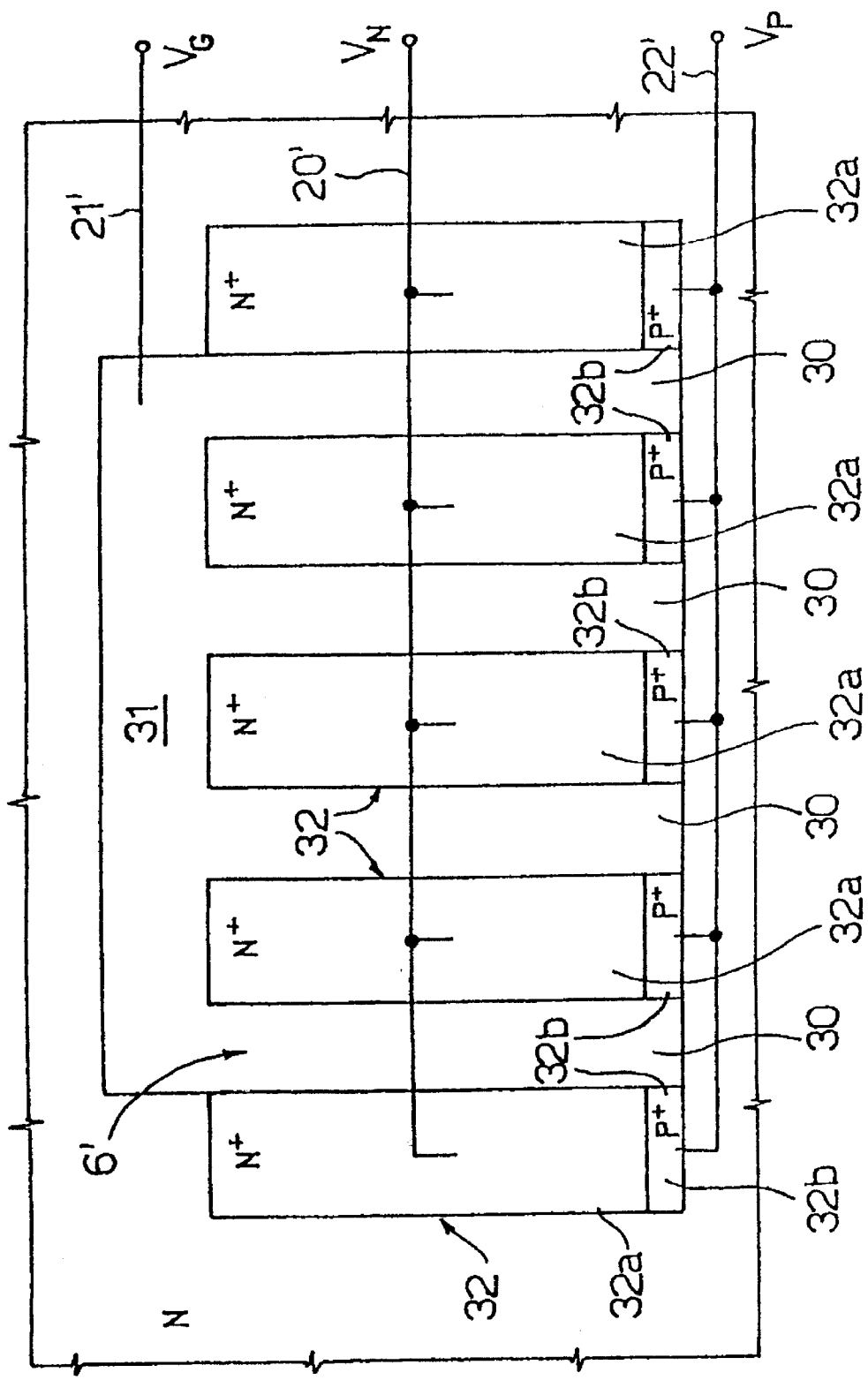
FIG. 3 shows a plan view of a wafer comprising a varactor, in a second embodiment of the present invention.

In particular, as illustrated in FIG. 3 (not to scale for the sake of simplicity), the gate region (here indicated at 6') can comprise a plurality of fingers 30, electrically connected at a respective end by a connection region 31, such that, in practice, the gate region 6' is comb-shaped. The fingers 30 are arranged parallel to one another, each overlapping a respective capacity modulation portion. When seen from above, the fingers 30 alternate with zones 32, formed inside the well 4, and each zone comprises a biasing region 32a, of N+ type, and an extraction region 32b, of $P^{30}$ type. All biasing regions 32a are biased to the same voltage $V_N$, as shown schematically by a connection line 20', and all the extraction regions 32b are biased to the same voltage $V_P$, as shown schematically by a connection line 22'. In this case, the overall capacity of the varactor is equivalent to the sum of the capacities associated with each finger 30, since the fingers are in parallel to each other.

Figure 4:
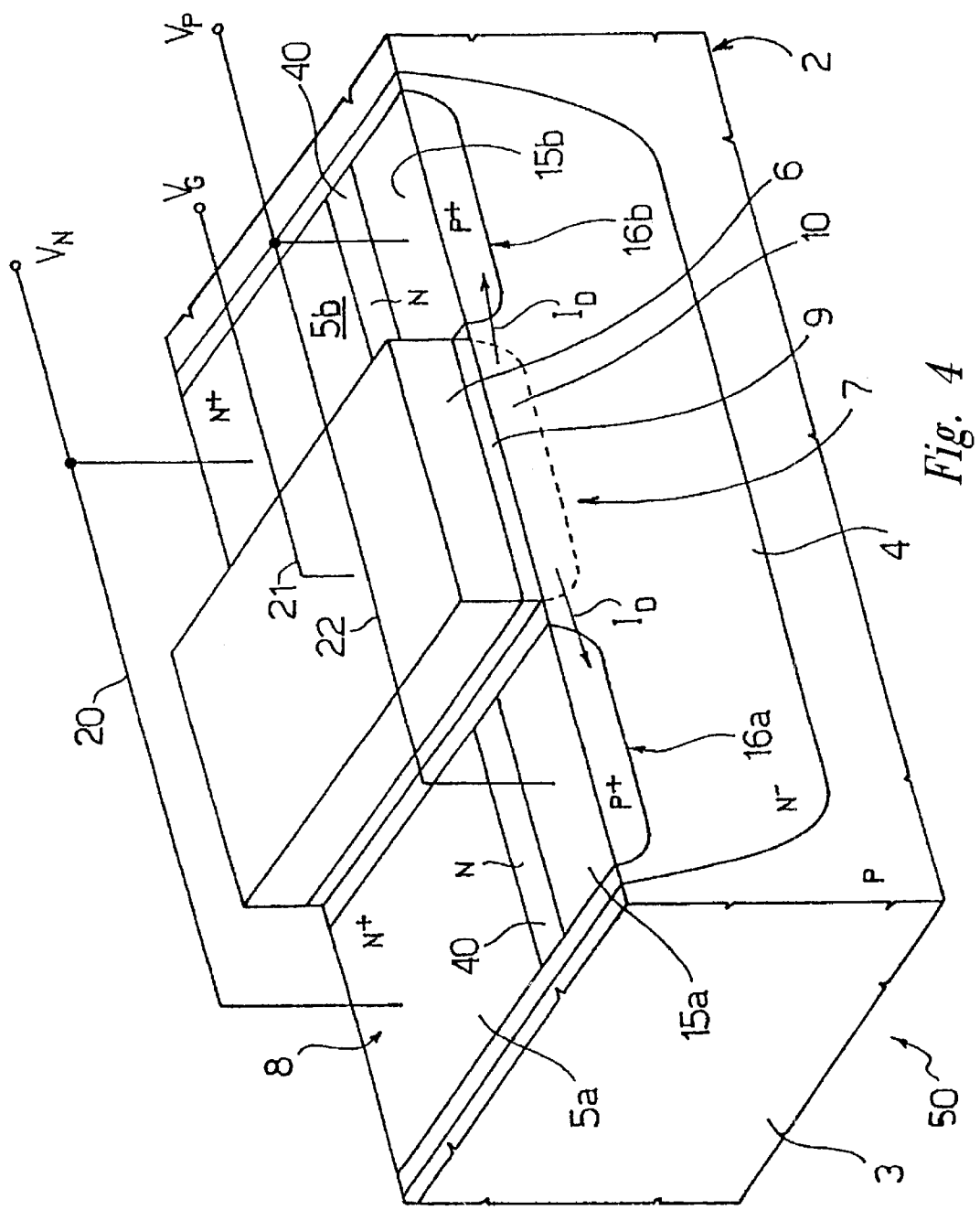
FIG. 4 shows a perspective cross-section through a wafer, incorporating a varactor according to a third embodiment of the present invention.

In addition, with reference to FIG. 4, intermediate zones 40 of N-type, with a lower doping level than the biasing regions 5a, 5b, but higher than the well 4 (for example of approximately $10^{18}$ atoms/cm$^3$–$10^{19}$ atoms/cm$^3$) can be formed respectively between the biasing region 5a and the respective extraction region 15a, and between the biasing region 5b, and the respective extraction region 15b. In this case, the length of the gate region 6 is given by the sum of the dimensions, in the same direction, of each of the biasing regions 5a, 5b of the respective intermediate zone 40, and of the respective extraction region 15a, 15b.

The intermediate zones 40 advantageously do not require corresponding masking steps, but can be formed simultaneously with regions belonging to the components of the circuit connected to the varactor 50 (typically the drain extension regions of NMOS transistors). Thereby, the capability of withstanding voltages is improved between each biasing region 5a, 5b, and the respective extraction region 15a, 15b.

Finally, the varactor 50 can be manufactured in dual form, in particular by forming inside a well of P-type, biasing regions of P+ type, and extraction regions of N+ type. In this case the voltages applied to the different regions have an opposite polarity to the described one.

Therefore, the above description of illustrated embodiments is not intended to be exhaustive or to limit the invention to the precise forms disclosed. Accordingly, the invention is not limited by the disclosure, but instead the scope of the invention is to be determined entirely by the following claims, which are to be construed in accordance with established doctrines of claim interpretation.

What is claimed is:

1. A varactor, comprising:

a semiconductor material body having a first conductivity type and a first doping level;

a first biasing region having said first conductivity type, a second doping level higher than the first doping level, and embedded in said semiconductor material body adjacent to a capacity modulation portion of said semiconductor material body;

a gate region, of conductive material arranged above and electrically insulated from said semiconductor material body at said capacity modulation portion;

a charge extraction region of a second conductivity type connected to said capacity modulation portion of said semiconductor material body;

a second biasing region of said first conductivity type spaced from said first biasing region by said capacity modulation portion; and a second extraction region of said second conductivity type, said first and second extraction regions being adjacent to a respective one of said first and second biasing regions on both sides of said capacity modulation portion.

2. A varactor, comprising:

a semiconductor material body having a first conductivity type and a first doping level;

a first biasing region having said first conductivity type, a second doping level higher than the first doping level, and embedded in said semiconductor material body adjacent to a capacity modulation portion of said semiconductor material body;

a gate region, of conductive material arranged above and electrically insulated from said semiconductor material body at said capacity modulation portion;

a charge extraction region of a second conductivity type connected to said capacity modulation portion of said semiconductor material body; and wherein said first biasing region and said first extraction region are aligned with one another in a zone of said semiconductor material body, said zone having substantially a same length as a length of said gate region.

3. The varactor according to claim 1 wherein said first and second extraction regions form a pair of PN junctions together with respective ones of said first and second biasing regions.

4. The varactor according to claim 1 further comprising a voltage withstanding region between said first and second extraction regions and respective ones of said first and second biasing regions, said voltage withstanding region having said first conductivity type and a third doping level comprised between said first and said second doping levels.

5. The varactor according to claim 1 wherein said first and second extraction regions are electrically connected to one another by an electrical connection line.

6. The varactor according to claim 1 wherein said gate region has a plurality of fingers extending above a corresponding plurality of capacity modulation regions and wherein said semiconductor material body comprises a plurality of zones alternating with said capacity modulation regions, each zone comprising a respective biasing region and a respective extraction region adjacent to one another.

7. The varactor according to claim 1 wherein said biasing regions are connected electrically to each other and wherein said extraction regions are connected electrically to each other.

8. The varactor according to claim 1 wherein said first conductivity type is N-type and said second conductivity type is P-type.

9. A method for modulating a capacity, the method comprising: providing a varactor, comprising:

a semiconductor material body of a first conductivity type and having a first doping level;

at least a first biasing region having said first conductivity type, having a second doping level higher than the first doping level, and embedded in said semiconductor material body adjacent to a capacity modulation portion of said semiconductor material body;

a gate region of conductive material arranged above and electrically insulated from said semiconductor material body at said capacity modulation portion;

biasing said semiconductor material body to a first potential;

biasing said gate region to a second potential different from said first potential to form a depletion region in said capacity modulation portion; and extracting charge from said capacity modulation portion through at least one charge extraction region biased to a third potential to attract minority carriers generated in said depletion region.

10. The method according to claim 9 wherein said first conductivity type is N-type, wherein said charge extraction region is arranged laterally to said capacity modulation portion and has P-type conductivity, wherein said second potential is lower than said first potential, and wherein said third potential is lower than or the same as said second potential.

11. A semiconductor device, comprising:

a semiconductor material body;

a biasing region formed in the semiconductor material body and including a portion that is adjacent in a first direction to a capacitance-varying region in the semiconductor material body;

a gate region arranged over the capacitance-varying region; and a charge extraction region formed adjacent in the first direction to the capacitance-varying region and extending in a second direction, transverse to the first direction, from the portion of the first biasing region that is adjacent in the first direction to the capacitance-varying region.

12. The device of claim 11 wherein the semiconductor material body has a first conductivity type and a first doping level and wherein the biasing region has the first conductivity type and a second doping level higher than the first doping level.

13. The device of claim 11 wherein the biasing region has a first conductivity type and wherein the charge extraction region has a second conductivity type.

14. A semiconductor device comprising:

semiconductor material body;

a biasing region formed in the semiconductor material body adjacent to a capacitance-varying region in the semiconductor material body;

a gate region arranged over the capacitance-varying region;

a charge extraction region extending from the first biasing region and formed adjacent to the capacitance-varying region; and an intermediate zone formed between the biasing region and the charge extraction region, the intermediate zone having a same conductivity type as the biasing region and having a doping level between a doping level of the biasing region and of the extraction region.

15. The device of claim 11, wherein the biasing region is a first biasing region, and further comprising a second biasing region formed in the semiconductor material body and electrically connected to the first biasing region.

16. The device of claim 11 wherein the biasing region has an N-type conductivity and the extraction region has a P-type conductivity.

17. The device of claim 11 wherein the biasing and extraction regions form PN junctions.

18. The device of claim 11 wherein:

the biasing region is one of a plurality of biasing regions;

the extraction region is one of a plurality of extraction regions;

the capacitance varying region is one of a plurality of capacitance varying regions; and wherein the gate region comprises a plurality of fingers extending over the corresponding plurality of capacitance-varying regions, the pluralities of biasing and extraction regions alternating between the plurality of fingers.

19. The device of claim 11 wherein the semiconductor material body has a doping level of approximately $2 \times 10^{17}$ atoms/cm$^3$.

20. The device of claim 11 wherein the extraction region has a doping level of approximately $10^{20}$ atoms/cm$^3$.

21. A method of modulating a capacitance, the method comprising:

providing a varactor having a semiconductor material body, a biasing region formed in the semiconductor material body adjacent a capacitance-varying portion, and a gate region disposed over the capacitance-varying portion;

biasing said semiconductor material body to a first potential;

biasing said gate region to a second potential different from said first potential to form a depletion region in said capacity modulation portion; and extracting charge from said capacitance-varying portion through at least one charge extraction region biased to a third potential to attract minority carriers generated in said depletion region.

* * * * *